Nov. 8, 1960 R. A. GESHNER ET AL 2,959,758

PRINTED CIRCUIT BOARD

Filed Dec. 29, 1955

INVENTORS
R. A. GESHNER
L. J. KEHL
BY J. R. Hall
ATTORNEY

United States Patent Office 2,959,758

Patented Nov. 8, 1960

2,959,758

PRINTED CIRCUIT BOARD

Robert A. Geshner, Rochester, N.Y., and Lawrence J. Kehl, Chicago, Ill., assignors to Western Electric Company, Incorporated, New York, N.Y., a corporation of New York Filed Dec. 29, 1955, Ser. No. 556,342

4 Claims. (Cl. 339—17)

This invention relates to printed wiring circuits, and has for objects thereof the provision of printed wiring boards readily interconnecting electrical components.

A further object of the invention is to provide printed wiring boards of the etched-foil type having terminals flush with the faces of the boards.

A printed wiring board made by a method illustrating certain features of the invention may include a card composed of electrical insulating material having on at least one face thereof a wiring pattern including sheet metal terminal portions extending to positions near one edge of the card. The ends of the terminal portions are pressed into the card sufficiently to be flush with the surface of the board so that damage to the terminal portions does not occur in inserting the terminal portions into jacks.

A complete understanding of the invention may be obtained from the following detailed description of a printed wiring board and method of making the same forming specific embodiments thereof, when read in conjunction with the appended drawings, in which.

Figures 1, 2, 3, 4:
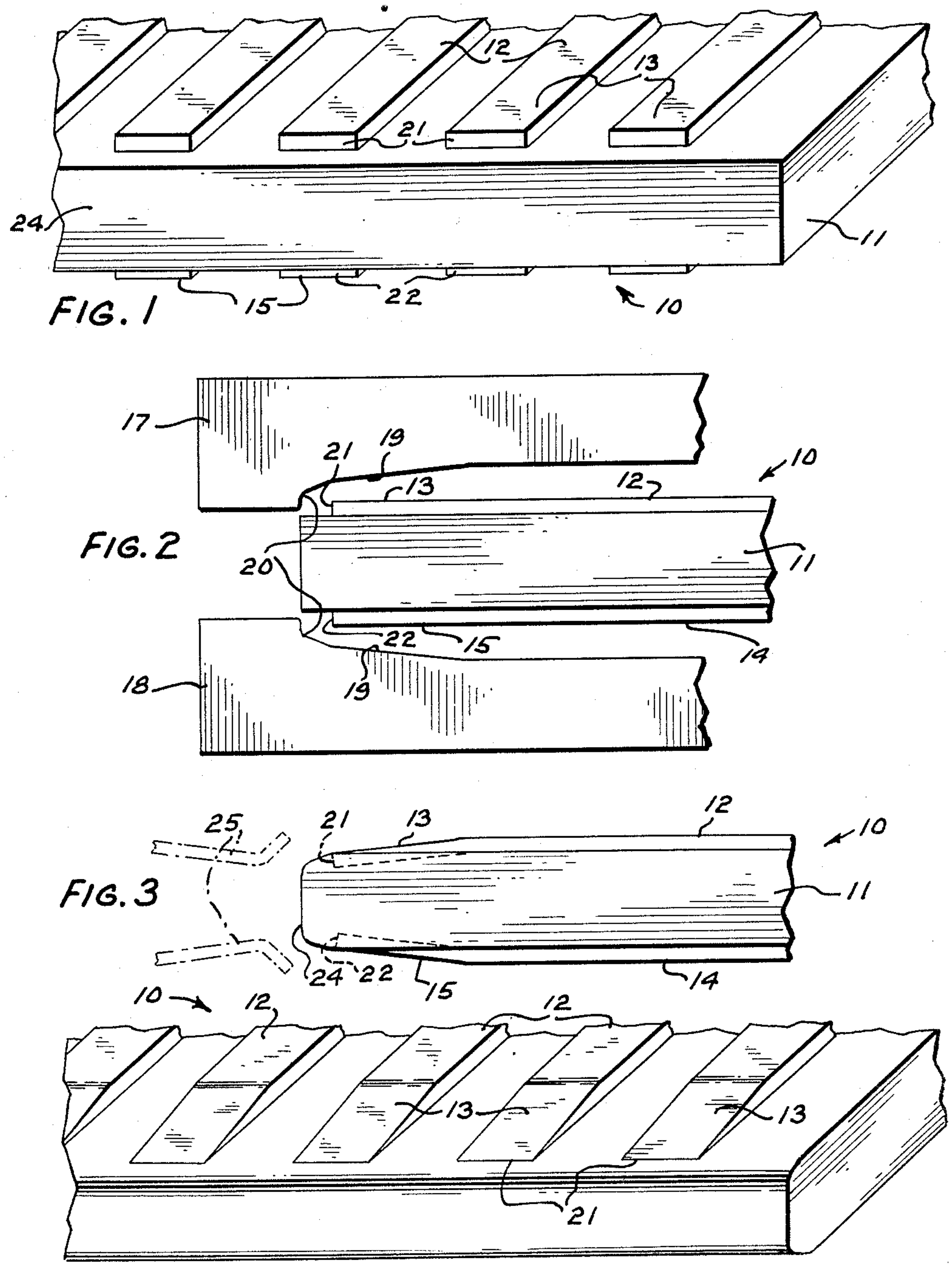
Fig. 1 is a fragmentary, perspective of an unfinished printed wiring board forming one embodiment of the invention.
Fig. 2 is a fragmentary elevation during one step of its manufacture.
Fig. 3 is a fragmentary elevation of the board shown in Fig. 1.
Fig. 4 is a fragmentary perspective of the printed wiring board in finished condition.

Referring now in detail to the drawings, a printed wiring board 10 includes a sheet or panel 11 composed of electrical insulating material, such as, for example, phenolic resin, thermoplastic material or the like. One suitable material is XXXP phenol fiber board. Where the panel is of phenolic resin or other thermosetting plastics, the panel is, at the start of this method, not cured sufficiently to have its optimum electrical characteristics, and has been cured only sufficiently to impart physical stability to the board. On the upper face of the sheet 11, a circuit pattern 12 of electroconductive foil or sheet, such as, for example, copper, aluminum or the like, having terminals 13 is bonded to the sheet 11 by an adhesive, such as, for example, an incompletely cured polyvinyl butyral-phenolic adhesive, a thermoplastic adhesive, or other thermosetting adhesives. The adhesive in the case of a thermosetting adhesive should be of a type curing at a slower rate than the panel 11 since the adhesive is on the exterior of the panel. A circuit pattern or indicia 14 of copper, aluminum, or the like, is bonded to the lower face of the sheet 11 by incompletely cured adhesive and includes terminals 15. The board 10 is heated to a temperature sufficient to soften somewhat the adhesive and the sheet 11, approximately 200° F., by suitable means, such as, for example, sliding them slowly along a heated guideway to platens 17 and 18, when the sheet 11 is phenol-fiber and the adhesive is a polyvinyl-butyral-phenolic type. The board while not is placed between the heated platens 17 and 18, which have sloping pressing portions 19 and rounded corner forming portions 20, and the platens are closed on the board with sufficient force to force ends 21 and 22 of the terminals 13 and 15, respectively, completely into the sheet 11 so that the ends 21 and 22 are flush with the faces of the sheet 11. Also, an edge 24 of the sheet is rounded at its corners by the corner-forming portions 20. The platens 17 and 18 and the preheating of the panels cure the panel 11 sufficiently to bring it to a condition having optimum electrical and physical properties. This also cures the adhesive to an optimum adhesive condition. Then the panel is removed.

When the sheet 11 is inserted into spring jacks 25, the rounded edge 24 and the embedded ends 21 and 22 do not catch on the jacks. Since the ends 21 and 22 do not catch, no tearing of the terminals from the sheet 11 occurs. Also, since only the ends 21 and 22 are embedded, excellent electrical contact occurs between the raised portions of the terminals and the jacks. The pressing of the ends of the terminals is effected while the panel and the adhesive are hot and uncured so that the panel 11 and the adhesive flow under the pressure applied thereto and there is no damage to the panel and the adhesive properties of the adhesive are not substantially lowered.

It is to be understood that the above-described arrangements are simply illustrative of the application of the principles of the invention. Numerous other arrangements may be readily devised by those skilled in the art which will embody the principles of the invention and fall within the spirit and scope thereof.

What is claimed is:

1. A printed wiring circuit which comprises a board of insulating material, a circuit pattern secured to said board, said board having recesses running substantially from the edges of said board toward said circuit pattern of gradually diminishing depth, and terminals emanating from said circuit pattern having thicknesses equal to the maximum depths of said recesses, said terminals being secured within said recesses so that the ends thereof are flush with the board.

2. A circuit connector comprising an insulating board having a metallic foil circuit pattern secured thereto, said board having a recess formed therein that tapers substantially from a maximum depth at one edge of the board toward the surface of the board in the vicinity of the circuit pattern, said circuit pattern including a terminal extending therefrom and positioned within the recess so that the end thereof is flush with the board.

3. A multi-terminal circuit connector comprising an insulating board having a metallic foil circuit pattern secured thereto, a plurality of metallic foil terminals formed integral with said circuit pattern and extending substantially to one edge of the board, said board having recesses therein tapering in depth toward one edge of the board, the ends of each terminal being embedded within the recesses formed in the board so that the upper end surface of each terminal is flush with the surface at the edge of the board.

4. A printed wiring circuit, which comprises a board of insulating material, a circuit pattern secured to said board, said board having rounded corners along one edge thereof an having recesses of gradually diminishing depth running substantially from said rounded corners toward said circuit pattern, and terminals emanating from said circuit pattern having thicknesses equal to the maximum depth of said recesses, said terminals being secured within said recesses so that the ends thereof are flush with the surface of said board.

References Cited in the file of this patent

UNITED STATES PATENTS

| | | |
|---|---|---|
| 2,288,735 | O'Connell | July 7, 1942 |
| 2,376,854 | Saunders | May 22, 1945 |
| 2,711,523 | Willis | June 21, 1955 |
| 2,716,268 | Stiegerwalt | Aug. 30, 1955 |
| 2,734,150 | Beck | Feb. 7, 1956 |
| 2,748,364 | Kamm | May 29, 1956 |
| 2,755,452 | Rogie | July 17, 1956 |
| 2,757,443 | Stiegerwalt et al. | Aug. 7, 1956 |

OTHER REFERENCES

Synthane TELE-TECH, December 1954, pages 104, 112.

Hannahs TELE-TECH, December 1955, page 79.